(12) United States Patent
Park et al.

(10) Patent No.: US 9,093,595 B2
(45) Date of Patent: Jul. 28, 2015

(54) PHOTO DETECTION DEVICE (71) Applicant: Seoul Viosys Co., Ltd., Ansan-si (KR)

(72) Inventors: Ki Yon Park, Ansan-si (KR); Chang Suk Han, Ansan-si (KR); Hwa Mok Kim, Ansan-si (KR); Hyo Shik Choi, Ansan-si (KR); Daewoong Suh, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 32 days.

(21) Appl. No.: 14/154,460

(22) Filed: Jan. 14, 2014

(65) Prior Publication Data

US 2014/0197454 A1    Jul. 17, 2014

(30) Foreign Application Priority Data

Jan. 16, 2013    (KR) .......................... 10-2013-0004789

(51) Int. Cl.
*H01L 31/102* (2006.01)
*H01L 31/109* (2006.01)
*H01L 31/0304* (2006.01)
*H01L 31/0236* (2006.01)
*H01L 31/0216* (2014.01)
*H01L 31/07* (2012.01)

(52) U.S. Cl.
CPC .......... *H01L 31/109* (2013.01); *H01L 31/0236* (2013.01); *H01L 31/02162* (2013.01); *H01L 31/03044* (2013.01); *H01L 31/03048* (2013.01); *H01L 31/07* (2013.01)

(58) Field of Classification Search
None
See application file for complete search history.

(56) References Cited

U.S. PATENT DOCUMENTS

2014/0183526 A1*   7/2014   Park et al. ..................... 257/43

* cited by examiner

*Primary Examiner* — Fei Fei Yeung Lopez
(74) *Attorney, Agent, or Firm* — H.C. Parks & Associates, PLC (57) ABSTRACT TA photo detection device, including a substrate, a band-pass filter layer formed over the substrate, a light absorption layer formed over the band-pass filter layer, a Schottky layer formed on a portion of the light absorption layer, a first electrode layer formed on a portion of the Schottky layer, and a second electrode layer formed on the light absorption layer and spaced apart from the Schottky layer.

29 Claims, 12 Drawing Sheets

PHOTO DETECTION DEVICE

CROSS-REFERENCE TO RELATED APPLICATION(S)

The present application claims priority under 35 U.S.C. 119(a) to Korean Application No. 10-2013-0004789, filed on Jan. 16, 2013, which is hereby incorporated by reference for all purposes as if fully set forth herein.

BACKGROUND

1. Field

Exemplary embodiments of the present invention relate to a photo detection device, and more particularly, to a photo detection device in which a specific wavelength region to be detected can be easily controlled by controlling an energy bandgap of a band-pass filter layer, and the tilt of a cut-off wavelength can be controlled using a reactivity tilt control layer.

2. Discussion of the Background

In a conventional semiconductor photo detection device, the semiconductor photo detection device is mounted on a package and a band-pass filter capable of transmitting only a specific wavelength is coated on a cover for protecting the semiconductor photo detection device, in order to detect a specific wavelength.

The cover is made of sapphire, crystal, or tempered glass, having excellent transmissivity and a high resistance to damage. In the band-pass filter, materials having excellent light penetrability, such as quartz, are used as coating materials in the form of a circle or a rectangle.

For example, in order to increase ultraviolet (UV) transmissivity, multiple layers made of $MgF_2$, $TiO_2$, or $SiO_2$ are coated on one surface of the filter, and UV coating materials having a high refractive index or a low refractive index are coated on the other surface of the filter.

The UV coating materials having a high refractive index may include any one of $HfO_2$, $Sc_2O_3$, $YbF_3$, $Y_2O_3$, $ZrO_2$, $NaF_3$, $Al_2O_3$, and $Sb_2O_3$. The UV coating materials having a low refractive index may include any one of $SiO_2$, ZnSe, $Sc_2O_3$, and ZnS.

The cover on which the filter fabricated as described above has been deposited transmits light having only a specific wavelength band. In general, the cover is expensive because it involves the filter manufacturing process. Furthermore, the cover is problematic in that it is generally necessary to strictly classify the direction of a surface on which the cover is mounted, when the cover is assembled, because coating on the front of the cover is different from coating on the back of the cover, thereby decreasing productivity.

The cover is also problematic in that it is difficult to secure reliability because the cover responds to wavelengths other than a specific wavelength region, when a surface of the cover is scratched.

In order to solve these and or other problems, a package capable of detecting light of a specific wavelength region without an additional coating on a cover has recently been developed.

For example, resin that transmits only a specific wavelength region is filled in a package over a photo detection device, without installing a cover.

The resin may be, for example, an epoxy resin. In general, the resin consists of two types of liquid components, that is, a polymer and a hardener. Here, a transmittance wavelength of a resin depends the mixture ratio of materials of the polymer.

Such products are commercially sold. For example, Phenyl Si epoxy series by Shin-Etsu Chemical Co., Ltd. have a cut-off wavelength of about 300 nm.

Epoxy resin, in which a specific substance is mixed so that it serves as a band-pass filter for a specific wavelength region as described above, is problematic in that the UV reactivity of a package is low if the package is exposed to strong UV source for a long time, because a yellowness phenomenon is generated.

Furthermore, the flatness of a surface in which the epoxy resin is formed has a direct connection with light detection efficiency. There is a problem in that a light detection characteristic is slightly changed because overall flatness is low in a surface or at the package interface, when the polymer and the hardener are hardened by putting them into the package. Such problems may reduce the reliability of a product.

SUMMARY

An exemplary embodiment of the present invention relates to a photo detection device that includes a band-pass filter layer, in which a range of a specific wavelength can be easily controlled by controlling an energy bandgap, and which can control the tilt of a cut-off wavelength using a reactivity tilt control layer.

In one embodiment, a photo detection device includes a substrate, a band-pass filter layer disposed on the substrate, a light absorption layer disposed on the band-pass filter layer, a Schottky layer disposed on a portion of the light absorption layer, a first electrode layer disposed on a portion of the Schottky layer, and a second electrode layer disposed on the light absorption layer and spaced apart from the Schottky layer.

The substrate may be any one selected from a sapphire substrate, an AlN substrate, a SiC substrate, and a GaN substrate.

A light incidence surface of the substrate may be a mirror surface having permeability.

The photo detection device may further include a buffer layer disposed between the substrate and the band-pass filter layer.

The buffer layer may have a larger energy bandgap than the band-pass filter layer.

The band-pass filter layer may absorb light of a specific wavelength region, and the light absorption layer may have a smaller energy bandgap than the band-pass filter layer.

The band-pass filter layer may include an $Al_xGa_{1-x}N$ (y<x<1) layer, and the light absorption layer may include an $Al_yGa_{1-y}N$ (0<y<x) layer or an $In_zGa_{1-z}N$ (0<z<1) layer.

The buffer layer may include an AlN layer.

The photo detection device may further include a reactivity tilt control layer disposed between the band-pass filter layer and the light absorption layer.

The reactivity tilt control layer may be formed to have a smaller energy bandgap from the band-pass filter layer to the light absorption layer.

The energy bandgap of the reactivity tilt control layer may be reduced linearly or by steps.

The reactivity tilt control layer may include an AlGaN layer, and the Al content of the reactivity tilt control layer decreases from the band-pass filter layer to the light absorption layer.

The photo detection device may further include a capping layer disposed on a portion of the light absorption layer, and the Schottky layer may be formed on a portion of the capping layer.

The capping layer may include a p-In$_d$Ga$_{1-d}$N (0<d<1) layer.

The Schottky layer may be made of any one selected from ITO, Pt, W, Ti, Pd, Ru, Cr, and Au.

In another exemplary embodiment, a photo detection device includes a band-pass filter layer, a light absorption layer disposed on a first surface of the band-pass filter layer, a Schottky layer disposed on a first surface of the light absorption layer, a first electrode layer disposed on a first surface of the Schottky layer, and a second electrode layer disposed on a portion of a second surface of the band-pass filter layer.

The photo detection device may further include a transparent electrode layer disposed on a second surface of the band-pass filter layer, and the second electrode layer may be formed on a portion of a second surface of the transparent electrode layer.

The band-pass filter layer may be formed in a first surface of a substrate, the substrate may be removed, and the band-pass filter layer may be etched to a specific thickness.

The substrate may be any one selected from a sapphire substrate, a SiC substrate, a GaN substrate, an AlN substrate, a Si substrate, and a GaAs substrate.

The band-pass filter layer may be etched to the thickness of 0.1 to 1 μm.

The band-pass filter layer may absorb light of a specific wavelength region, and the light absorption layer may have a smaller energy bandgap than the band-pass filter layer.

The band-pass filter layer may include an Al$_x$Ga$_{1-x}$N (y<x<1) layer, and the light absorption layer may include an Al$_y$Ga$_{1-y}$N (0<y<x) layer or an In$_z$Ga$_{1-z}$N (0<z<1) layer.

The photo detection device may further include a reactivity tilt control layer disposed between the band-pass filter layer and the light absorption layer.

The reactivity tilt control layer may be formed to have a smaller energy bandgap from the band-pass filter layer to the light absorption layer.

The energy bandgap of the reactivity tilt control layer may be reduced linearly or by steps.

The reactivity tilt control layer may include an AlGaN layer, and the Al content of the reactivity tilt control layer may be decreased from the band-pass filter layer to the light absorption layer.

The photo detection device may further include a capping layer disposed between the light absorption layer and the Schottky layer.

The capping layer may include a p-In$_d$Ga$_{1-d}$N (0<d<1) layer.

The Schottky layer may be made of any one selected from ITO, Pt, W, Ti, Pd, Ru, Cr, and Au.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

Furthermore, terms to be described later are defined by taking the functions of embodiments of the present invention into consideration, and may be different according to the operator's intention or usage. Accordingly, the terms should be defined based on the overall contents of the specification.

For example, in the specification, when it is described that a layer is "on" another layer or a substrate, the layer may be directly formed on another layer or the substrate or a third layer may be interposed between the layer and another layer or the substrate. Furthermore, in the specification, directional expressions, such as 'the upper side', an 'upper (part)', and an 'upper surface' may also be understood as meanings, such as 'the lower side', a 'lower (part)', and a 'lower surface'. That is, expressions in spatial directions should be interpreted as being relative directions, but should not be interpreted as being limited as if the spatial directions mean absolute directions. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Furthermore, the following embodiments are not intended to limit the scope of the present invention, but are intended to illustrate elements proposed in the claims of the present invention. An embodiment including an element that is included in the technical spirit written in the specification of the present invention and that may be substituted with an element of the claims may be included in the scope of the present invention.

Furthermore, the following embodiments illustrate the detection of UV light, but the present invention may also be used to detect light having different wavelength regions.

Figure 1:
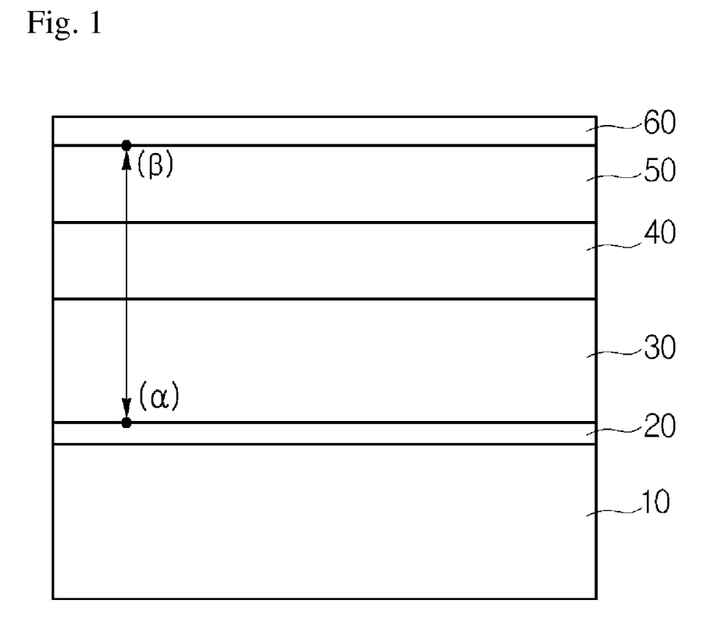
FIG. 1 shows a growth structure in accordance with an exemplary embodiment of the present invention.
Figure 5A:
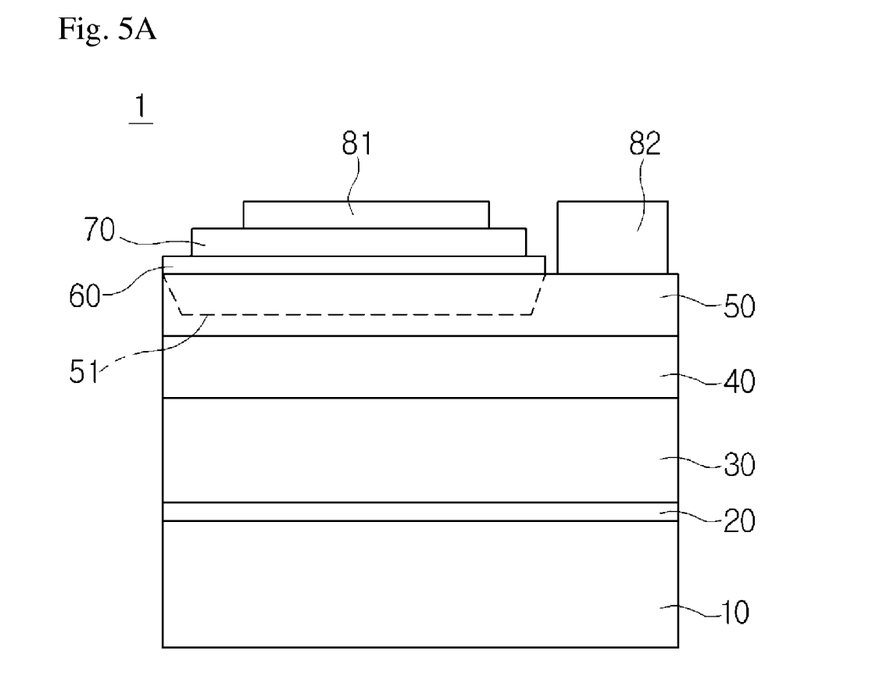
FIGS. 5A and 5B are a cross-sectional view and a plan view of a photo detection device in accordance with an exemplary embodiment of the present invention.
Figure 5B:
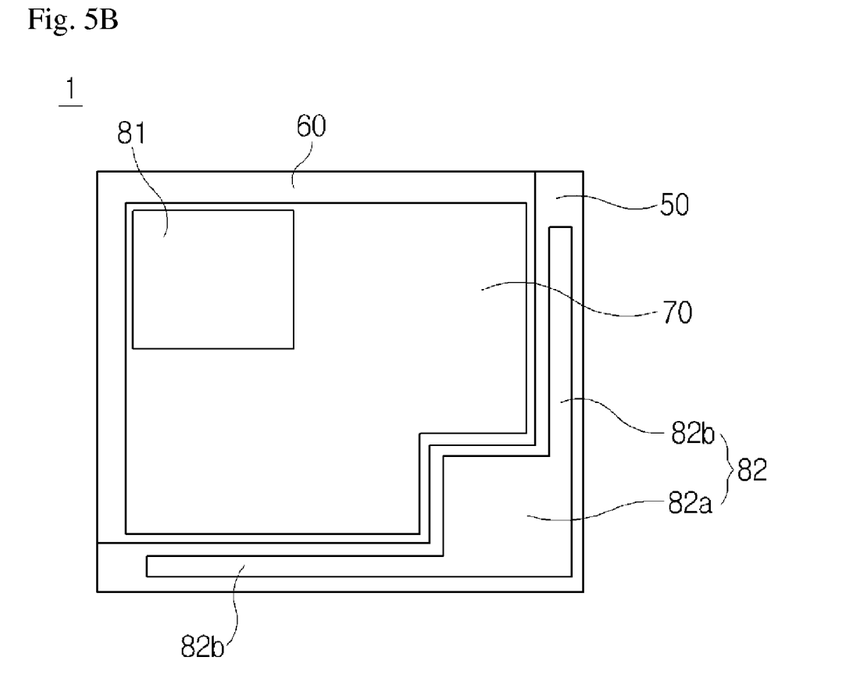

FIG. 1 shows a growth structure in accordance with an exemplary embodiment of the present invention. Referring to FIG. 1, in order to fabricate a photo detection device 1 (refer to FIG. 5) in accordance with an exemplary embodiment of the present invention, a buffer layer 20, a band-pass filter layer 30, a reactivity tilt control layer 40, and a light absorption layer 50 are sequentially grown over a substrate 10. A capping layer 60 is formed over the light absorption layer 50 in order to facilitate a Schottky characteristic of a Schottky layer 70.

The substrate 10 may be made of a substance having a high light transmissivity, such as sapphire, AlN, or SiC. The surface between the substrate 10 and a buffer layer 20 may be formed mirror surface for uniform light-transference. The substrate 10 is placed in the susceptor of the reaction chamber of a Metal Organic Chemical Vapor Deposition (MOCVD) apparatus. Impurity gases within the reaction chamber are removed by decreasing pressure within the reaction chamber to 100 torr or less.

Pressure within the reaction chamber is maintained at 100 torr, and the temperature within the reaction chamber is raised to 1150° C., thereby thermally washing a surface of the heterogeneous substrate 10. Next, the temperature within the reaction chamber is reduced to 1050° C., and a high-temperature AlN layer, that is, the buffer layer 20 is grown while supplying an Al source and ammonia ($NH_3$) gas into the reaction chamber. Here, the overall gas flow within the reaction chamber is determined by hydrogen ($H_2$) gas (carrier gas).

In order to grow a low-temperature AlN layer as the buffer layer 20, a growth temperature may be set to about 600° C. In order to use a high-temperature AlN layer as the buffer layer 20, other growth conditions are the same, but a growth temperature may be set to 1200° C. to 1500° C., in order to improve the crystallizability of AlN.

In general, a low transmissivity problem attributable to defects can be reduced by growing the buffer layer 20 at a high temperature. If the thickness of the buffer layer 20 is increased, light transmissivity is decreased. In order to increase light transmissivity, the thickness of the buffer layer 20 may be 25 nm or less.

After growing the buffer layer 20, temperature within the susceptor is set to 1000° C. to 1100° C., and the band-pass filter layer 30 is grown at a pressure of 100 torr or less, within the reaction chamber. Here, the band-pass filter layer 30 should have a smaller energy bandgap than the substrate 10 or the buffer layer 20, but should have a larger energy bandgap than the light absorption layer 50.

An AlGaN layer may be grown as the band-pass filter layer 30. If an $Al_xGa_{1-x}N$ (y<x<1) layer is grown as the band-pass filter layer 30, an $Al_yGa_{1-y}N$ (0<y<x) layer may be grown as the light absorption layer 50.

After growing the band-pass filter layer 30, the light absorption layer 50, having a smaller energy bandgap than the band-pass filter layer 30, is grown over the band-pass filter layer 30. For example, the light absorption layer 50 is grown under the same growth conditions as the band-pass filter layer 30, but may be grown to have a different Al composition from that of the band-pass filter layer 30.

If an $In_zGa_{1-z}N$ (0<z<1) layer is grown as the light absorption layer 50, the growth temperature is set to 1000° C. or less. If an In source is injected, an energy bandgap is different depending on a difference in the growth temperature under the same reaction chamber conditions. In general, the $In_zGa_{1-z}N$ (0<z<1) layer is grown at a growth temperature of 500° C. to 900° C.

Each of the band-pass filter layer 30 and the light absorption layer 50 may have a thickness of 2 μm or less. This is because if the thickness is increased, light transmissivity is decreased. The band-pass filter layer 30 and the light absorption layer 50 should be made as thin as possible, so long as a suitable crystal structure is achieved.

In order to control the tilt of a cut-off wavelength of the photo detection device 1, the reactivity tilt control layer 40 may be grown between the band-pass filter layer 30 and the light absorption layer 50. The reactivity tilt control layer 40 is grown over the band-pass filter layer 30. The reactivity tilt control layer 40 is grown such that the energy bandgap of the reactivity tilt control layer 40 slowly decreases from the energy bandgap of the band-pass filter layer 30 to the energy bandgap of the light absorption layer 50 (refer to FIG. 2B).

The reactivity tilt control layer 40 has almost the same growth conditions as the light absorption layer 50, but has a different Al composition from the light absorption layer 50. That is, the reactivity tilt control layer 40 is grown by changing the Al composition when growing the AlGaN layer, so that the Al composition slowly decreases after growing the band-pass filter layer 30. Thus, the energy bandgap of the reactivity tilt control layer 40 reaches the energy bandgap of the light absorption layer 50.

Figure 2A:
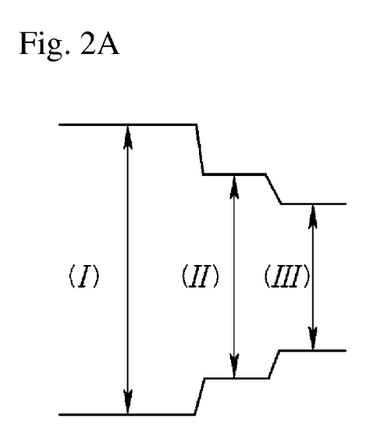
FIGS. 2A, 2B, and 2C show the energy bandgaps of the growth structure of FIG. 1.
Figure 2B:
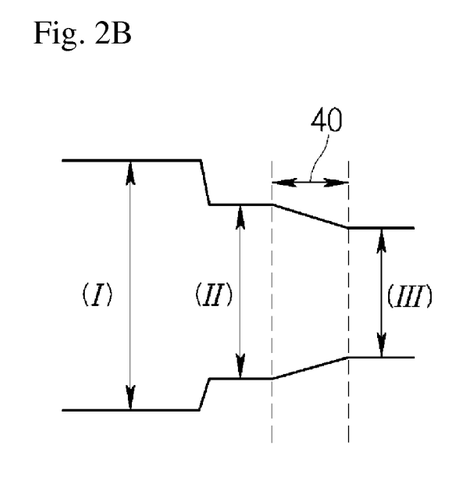
Figure 2C:
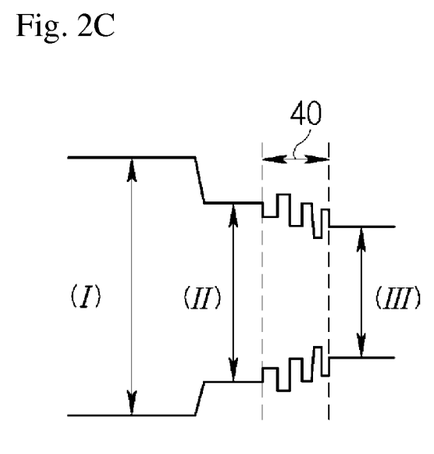

The reactivity tilt control layer 40 may be grown so that the energy bandgap of the reactivity tilt control layer 40 is decreased in steps (refer to FIG. 2C). The reactivity tilt control layer 40 may have a thickness of 500 nm or less, in order to improve light transmittance efficiency.

After growing the light absorption layer 50, a p-$In_dGa_{1-d}N$ (0<d<1) layer doped with Mg is grown over the light absorption layer 50 as the capping layer 60. In this case, a Schottky characteristic of the Schottky layer 70 can be facilitated.

The capping layer 60 may have a thickness of 10 nm or less. If the capping layer 60 is too thick, both a Schottky characteristic and a PN characteristic appear, because a P characteristic becomes significant.

In the p-type electrical characteristics of the capping layer 60, an Mg doping concentration may only be about '$<5 \times 10^{17}/cm^3$' when measuring halls. The electrical characteristics of the capping layer 60 can be easily evaluated if the p-$In_dGa_{1-d}N$ (0<d<1) layer of less than 0.5 μm is additionally grown.

In order to grow a p-GaN layer as the capping layer 60, the p-GaN layer may be grown at the same temperature as the light absorption layer 50. In order to grow the p-$In_dGa_{1-d}N$ (0<d<1) layer as the capping layer 60, however, the p-$In_dGa_{1-d}N$ (0<d<1) layer is grown at a temperature of about 800° C. This is because an In composition may be changed depending on a growth temperature, although the same In source is supplied. Meanwhile, in growing the capping layer 60, a supperlattice layer of p-GaN/InGaN may be grown.

FIGS. 2A-2C are graphs showing the energy bandgaps of the growth structure of FIG. 1. FIG. 2 shows an example in which a sapphire substrate is used as the substrate 10, an $Al_{0.5}Ga_{0.5}N$ layer is used as the band-pass filter layer 30, and an $Al_{0.2}Ga_{0.8}N$ layer is used as the light absorption layer 50.

In FIG. 2A, an (I) layer is the sapphire substrate 10, an (II) layer is the band-pass filter layer 30 formed of the $Al_{0.5}Ga_{0.5}N$ layer, and an (III) layer is the light absorption layer 50 formed of the $Al_{0.2}Ga_{0.8}N$ layer. In this case, the photo detection device 1 is capable of detecting a wavelength range of about 260 to 320 nm.

Meanwhile, if the (I) layer is formed of the sapphire substrate 10, the (II) layer is formed of an $Al_{0.2}Ga_{0.8}N$ layer, and the (III) layer is formed of an $Al_{0.1}Ga_{0.9}N$ layer, the photo detection device 1 is capable of detecting a wavelength of about 320 to 400 nm.

FIGS. 2B and 2C illustrate examples in which the reactivity tilt control layer 40 is inserted between the band-pass filter layer 30 and the light absorption layer 50. FIG. 2B shows a structure in which the energy bandgap of the reactivity tilt control layer 40 is slowly decreased from the band-pass filter layer 30. In this structure, the slot of a specific cut-off wavelength can be controlled. Furthermore, FIG. 2C shows a structure in which the energy bandgap of the reactivity tilt control layer 40 is controlled by steps. In such a case, the crystallizability of the light absorption layer 50 can be improved. Here, in order to improve light transmittance efficiency, the reactivity tilt control layer 40 may have a thickness of 500 nm or less, as described above.

Figure 3:
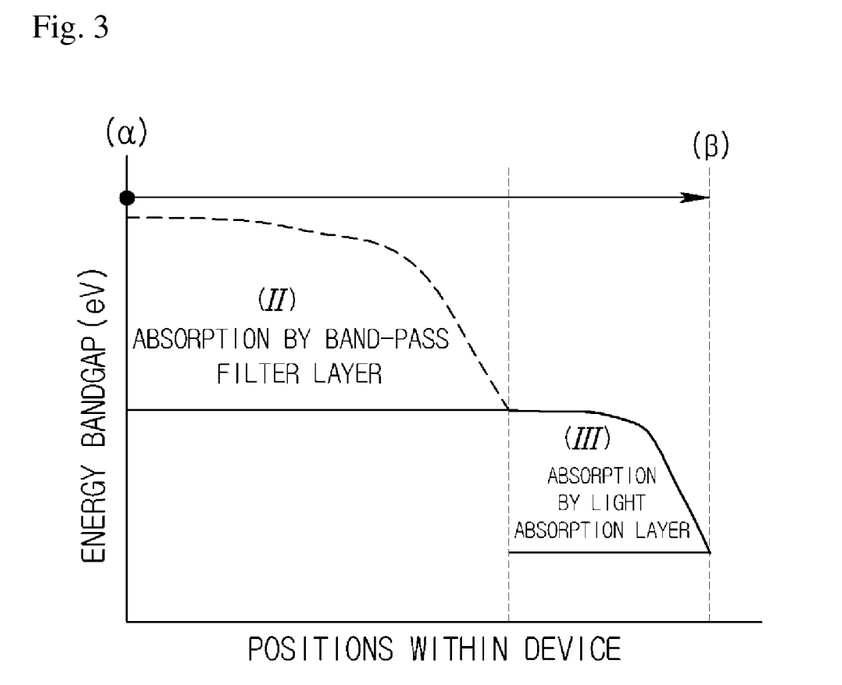
FIG. 3 is a graph showing the absorption of light according to an energy bandgap in the growth structure of FIG. 1.

FIG. 3 is a graph showing the absorption of light according to an energy bandgap in the growth structure of FIG. 1. As shown in FIG. 3, light having an energy bandgap greater than the energy bandgap of the band-pass filter layer 30 is absorbed by the band-pass filter layer 30, and light having an energy bandgap smaller than the energy bandgap of the band-pass filter layer 30 passes through the band-pass filter layer 30 and is absorbed by the light absorption layer 50, depending on the positions α~β of the growth structure shown in FIG. 1.

Light of a wavelength band that is absorbed by the light absorption layer 50, without being absorbed by the band-pass filter layer 30, makes an electric current flow into the photo detection device 1. Here, the amount of incident light to be detected can be measured by detecting the electric current.

Figure 4:
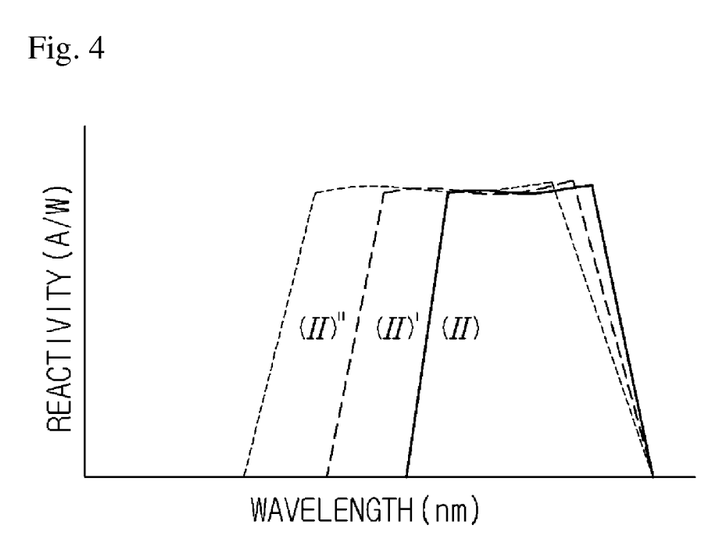
FIG. 4 is a graph showing an example in which a wavelength region is controlled by control of the energy bandgap of a band-pass filter layer in the growth structure of FIG. 1.

FIG. 4 is a graph showing examples in which a wavelength region is controlled by control of the energy bandgap of the band-pass filter layer in the growth structure of FIG. 1. As described above, light of a wavelength region that passes through the band-pass filter layer 30 without being absorbed is absorbed by the light absorption layer 50, thereby making an electric current flow. Accordingly, only a specific wavelength region can be detected.

As shown in FIG. 4, a wavelength region absorbed by the band-pass filter layer 30 can be controlled to be (II)' or (II)" by controlling the energy bandgap of the band-pass filter layer 30. If the band-pass filter layer 30 is formed of an AlGaN layer, the energy bandgap of the band-pass filter layer 30 can be controlled by changing an Al composition. If the band-pass filter layer 30 is formed of an InGaN layer, the energy bandgap of the band-pass filter layer 30 can be controlled by changing an In composition/concentration.

FIGS. 5A and 5B are a cross-sectional view and a plan view of the photo detection device 1. As shown in FIG. 5A, the photo detection device 1 includes a first electrode layer 81, and a second electrode layer 82 formed over the growth structure of FIG. 1.

The second electrode layer 82 may be formed on the light absorption layer 50 by etching part of the capping layer 60 in such a way as to be separated from the capping layer 60, or may be formed by partially etching both the capping layer 60 and the light absorption layer 50. The second electrode layer 82 is configured to have an ohmic characteristic. The second electrode layer 82 is commonly made of a metal, such as Cr, Ni, or Au. The second electrode layer 82 has different electrode characteristics depending on the thickness of the metal. The second electrode layer 82 generally has a total thickness of 400 nm or more.

As shown in FIG. 5B, the second electrode layer 82 is configured to have a wing shape. More particularly, the second electrode layer 82 is configured to include a body 82a spaced apart from the Schottky layer 70 and formed in a corner on the light absorption layer 50, and a pair of wings 82b extending along respective edges of the light absorption layer 50 from the body 82a.

After forming the second electrode layer 82, the Schottky layer 70 is deposited on the capping layer 60. In order to reduce metal deformation when adhering a first electrode pad 91 to the Schottky layer 70, the Schottky layer 70 may have a thickness of 10 nm or more.

A depletion layer 51 is formed under the Schottky layer 70. An energy wavelength band greater than a wavelength absorbed by the light absorption layer 50, of incident wavelengths on the depletion layer 51, influences the formation of an electric current. Furthermore, any one of ITO, Pt, W, Ti, Pd, Ru, Cr, and Au may be used as the Schottky layer 70.

The first electrode layer 81 is formed on a portion of the Schottky layer 70. The first electrode layer 81 may be made of a metal alloy, such as Ti/Al or Ni/Au. The first electrode layer 81 may have a thickness of 200 nm or more.

Figure 6:
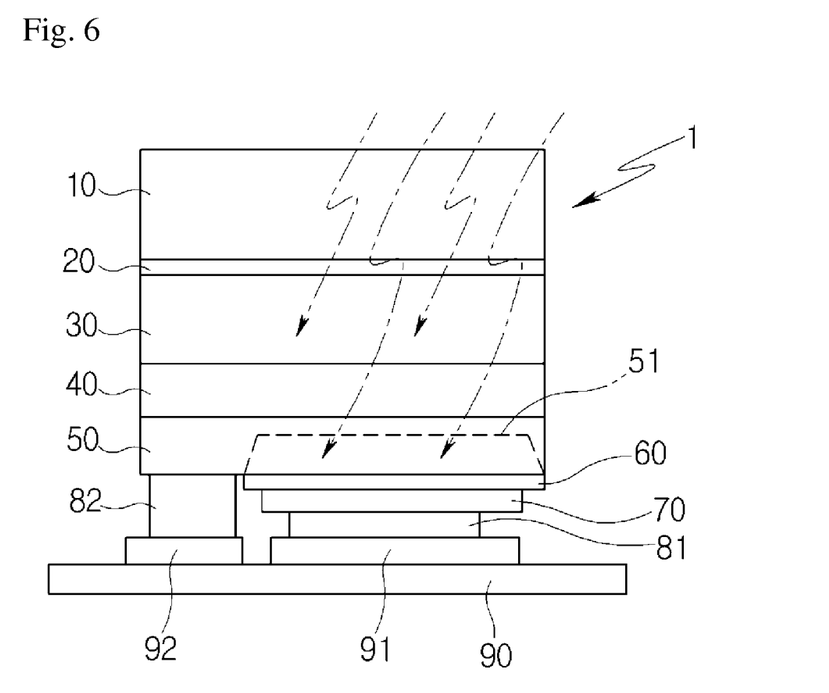
FIG. 6 shows a state in which the photo detection device of FIGS. 5A and 5B is used.

FIG. 6 shows a state in which the photo detection device 1 is used. As shown in FIGS. 5A and 5B, the photo detection device 1, in which the first electrode layer 81 and the second electrode layer 82 have been formed, is adhered on a flip-chip package pad 90, thus resulting in a flip-chip structure.

The first electrode pad 91 and a second electrode pad 92 are spaced apart from each other and provided on the package pad 90. The first electrode layer 81 of the photo detection device 1 is adhered to the first electrode pad 91 of the package pad 90, and the second electrode layer 82 of the photo detection device 1 is adhered to the second electrode pad 92 of the package pad 90, leading to a flip-chip structure. Here, external light is incident on the substrate 10.

Figure 7:
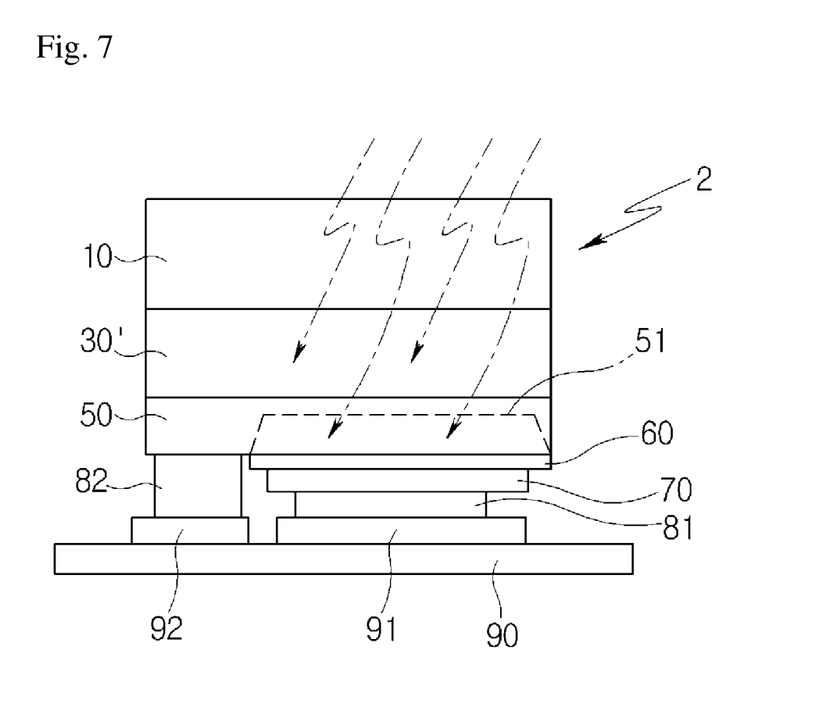
FIG. 7 shows a state in which a photo detection device, in accordance with an exemplary embodiment of the present invention, is used.

FIG. 7 shows a state in which a photo detection device 2 in accordance with an exemplary embodiment of the present invention is used. The photo detection device 2 has almost the same construction as that of the photo detection device 1, except that the buffer layer and the reactivity tilt control layer of the first embodiment are not formed. Accordingly, the same elements are assigned the same reference numerals, and a redundant description thereof is omitted.

Referring to FIG. 7, a band-pass filter layer 30' is formed on a substrate 10, and a light absorption layer 50 is formed on the band-pass filter layer 30'. That is, a buffer layer and a reactivity tilt control layer, such as those of the photo detection device 1, are not formed.

The band-pass filter layer 30' may be grown under the same growth conditions as the band-pass filter layer of photo detection device 1 and at a pressure of 300 to 600 torr. The band-pass filter layer 30' may be grown in three dimensional (3D) growth conditions. However, when a growth rate of 2 μm/hr drops to 1 μm/hr or less, at a pressure of 100 torr, two dimensional (2D) growth conditions are produced, which prevents a large number of pits from being formed on a surface of the band-pass filter layer 30'. However, the band-pass filter layer 30' may be grown in the 3D growth conditions, while the growth rate of 2 μm/hr drops to a specific growth rate and may be grown in 2D growth conditions, at a pressure of 600 torr or more, depending on growth equipment.

The omission of a buffer layer results in an increase in the amount of light absorbed by the light absorption layer 50.

Figure 8:
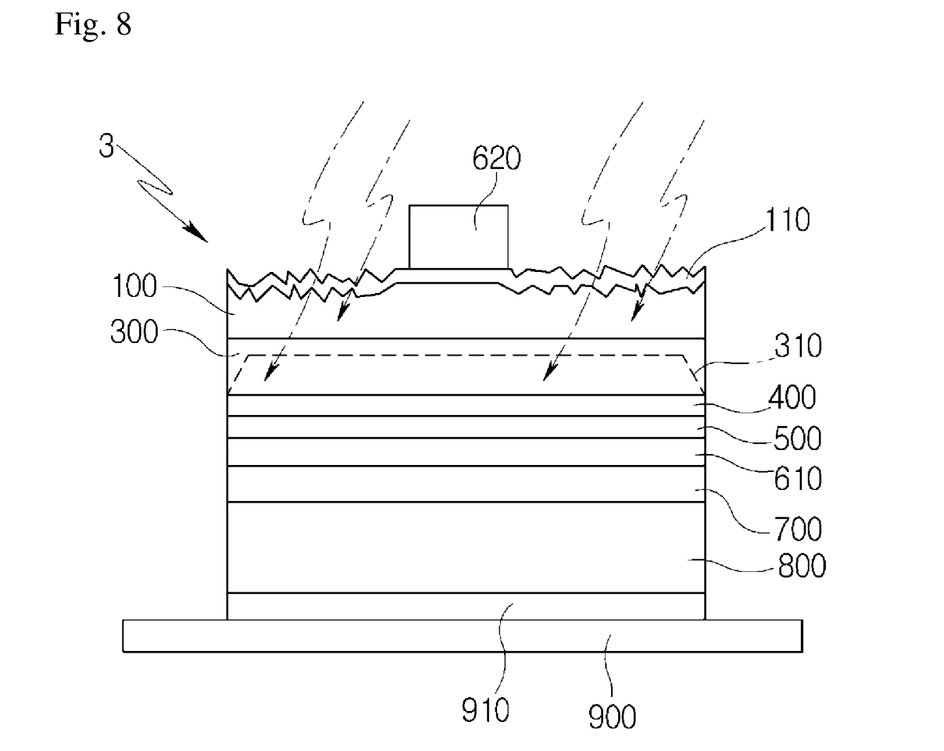
FIG. 8 shows a state in which a photo detection device, in accordance with an exemplary embodiment of the present invention, is used.

FIG. 8 shows a state in which a photo detection device 3 in accordance with an exemplary embodiment of the present invention is used. It is to be noted that the same materials as noted above may be used to form a band-pass filter layer 100, a light absorption layer 300, a capping layer 400, a Schottky layer 500, a first electrode layer 610, and a second electrode layer 620.

The photo detection device 3 has a structure in which the Schottky layer 500 and the first electrode layer 610 are formed over the capping layer 400, a bonding metal layer 700 is formed on the first electrode layer 610, and the bonding metal layer 700 is adhered to a bonding substrate layer 800, thereby improving light transmissivity, by obviating a heterogeneous substrate.

Furthermore, the light absorption layer 300 and the band-pass filter layer 100 are sequentially formed over a surface opposite a surface of the capping layer 400 that neighbors the Schottky layer 500. A transparent electrode layer 110 is formed in the band-pass filter layer 100, and the second electrode layer 620 is formed on a portion of the transparent electrode layer 110. A depletion layer 310 is formed within the light absorption layer 300.

The bonding metal layer 700 is adhered to the additional bonding substrate layer 800, at a specific temperature and pressure. A metal layer or a conductive substrate may be used as the bonding substrate layer 800. If the bonding metal layer 700 and the bonding substrate layer 800 are configured as described above and adhered to a first electrode pad 910 on a package pad 900, there is an advantage in that heat generated from incident light can be easily discharged externally.

In the present embodiments, the heterogeneous substrate may be removed by a laser lift-off process, if a physically and chemically stable sapphire substrate is used, and may be removed by etching if a substrate made of Si, GaAs, SiC, or ZnO that can be etched is used. The reason why the heterogeneous substrate is removed as described above is to control the thickness of the band-pass filter layer 100.

There may be many defects in a GaN-based growth layer, because a substrate with a defect density of $10^5/cm^2$ or less using GaN series has not yet been commercialized. Such detects become factors that reduce light transmissivity of the light absorption layer, when light is absorbed by the band-pass filter layer.

Furthermore, if a buffer layer is grown on the heterogeneous substrate and the band-pass filter layer is grown to a thickness of 1 µm or less, the band-pass filter layer may have a high defect density of $10^9/cm^2$ or more. Such defects may reduce the amount of light that reaches the light absorption layer, because light is absorbed by the band-pass filter layer, even when the light has an energy bandgap smaller than that of the band-pass filter layer.

Furthermore, the crystallizability of the band-pass filter layer has a close relationship with the crystallizability of the light absorption layer. The number of defects is reduced in such a manner that defects of about $10^{10}/cm^2$ or more, present at the interface between the light absorption layer and the buffer layer grown on the heterogeneous substrate, become distinct as a thickness is increased.

If the crystallizability of the band-pass filter layer is reduced, the light of reactivity of the light absorption layer is reduced, because the crystallizability of the light absorption layer is reduced. As a result, device characteristics are degraded because a leakage current is increased. For this reason, the band-pass filter layer may have a thickness of 1 µm or less and excellent crystallizability. The band-pass filter layer may transmit some light and absorb some light.

The band-pass filter layer 100 having a thickness of 2 to 5 µm is grown on a substrate, the substrate is separated from the band-pass filter layer 100, and the thickness of the band-pass filter layer 100 is reduced to 0.1 to 1 µm, by removing an interface between the band-pass filter layer 100 and the substrate that has many defects, through dry etching. Accordingly, the photo detection device 3 having a small number of defects and excellent light absorption rate and light transmissivity can be fabricated.

Here, the band-pass filter layer 100 is etched, so that an etched surface of the band-pass filter layer 100 has a specific roughness. In such a case, the amount of external incident light can be increased because a surface area of the band-pass filter layer 100 is increased.

After etching the band-pass filter layer 100, the transparent electrode layer 110 is formed on the band-pass filter layer 100. The transparent electrode layer 110 is formed to a thickness of 10 nm or less using Ni/Au, by taking light transmissivity into consideration.

The second electrode layer 620 is formed on a portion of the transparent electrode layer 110, and the bonding substrate layer 800 is attached to the first electrode pad 910 of the package pad 900, thereby forming a chip structure. External light is incident through the band-pass filter layer 100.

Figure 9:
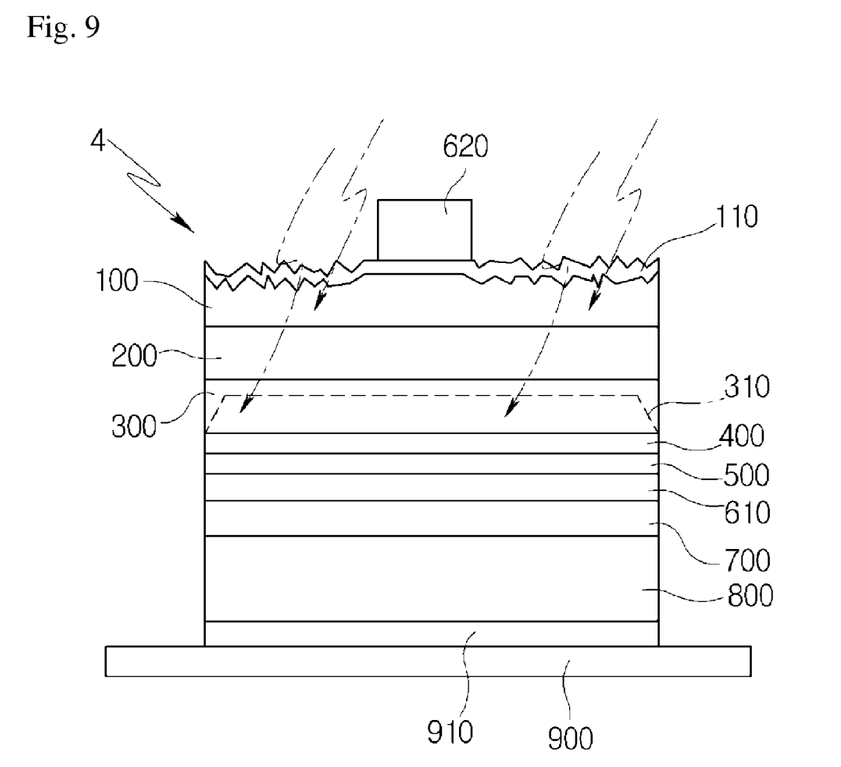
FIG. 9 shows a state in which a photo detection device, in accordance with an exemplary embodiment of the present invention, is used.

FIG. 9 shows a state in which a photo detection device 4 in accordance with an exemplary embodiment of the present invention is used. The photo detection device 4 has almost the same construction as the photo detection device 3, except that a reactivity tilt control layer 200 is formed between a band-pass filter layer 100 and a light absorption layer 300. Accordingly, the same elements are assigned the same reference numerals, and a redundant description thereof is omitted. The reactivity tilt control layer 200 may have the same construction as that of the photo detection device 1.

In accordance with the photo detection device according to an embodiment of the present invention, there are advantages in that costs can be reduced and productivity can be improved, because an additional band-pass filter needs not to be deposited on a cover, as in the related art, and reliability reduction attributable to external physical forces, such as a phenomenon in which a surface of a filter is scratched, can be prevented.

Furthermore, there is an advantage in that reliability of a product can be secured for a long term because surface irregularities or a yellowness phenomenon is not generated. Furthermore, there are advantages in that a range of a specific wavelength to be detected can be easily controlled by controlling the energy bandgap of the band-pass filter layer and the tilt of a cut-off wavelength can be controlled using the reactivity tilt control layer.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A photo detection device, comprising:
   a substrate;
   a band-pass filter layer disposed on the substrate;
   a light absorption layer disposed on the band-pass filter layer;
   a Schottky layer disposed on a portion of the light absorption layer;
   a first electrode layer disposed on a portion of the Schottky layer; and
   a second electrode layer disposed on the light absorption layer and spaced apart from the Schottky layer.

2. The photo detection device of claim 1, wherein the substrate is selected from a sapphire substrate, an AlN substrate, a SiC substrate, and a GaN substrate.

3. The photo detection device of claim 1, wherein a light incidence surface of the substrate is a mirror surface having permeability.

4. The photo detection device of claim 1, further comprising a buffer layer disposed between the substrate and the band-pass filter layer.

5. The photo detection device of claim 4, wherein the buffer layer has a larger energy bandgap than the band-pass filter layer.

6. The photo detection device of claim 5, wherein:
the band-pass filter layer is configured to absorb light of a specific wavelength region; and
the light absorption layer has a smaller energy bandgap than the band-pass filter layer.

7. The photo detection device of claim 6, wherein:
the band-pass filter layer comprises an $Al_xGa_{1-x}N$ ($y<x<1$) layer; and
the light absorption layer comprises an $Al_yGa_{1-y}N$ ($0<y<x$) layer or an $In_zGa_{1-z}N$ ($0<z<1$) layer.

8. The photo detection device of claim 7, wherein the buffer layer comprises an AlN layer.

9. The photo detection device of claim 6, further comprising a reactivity tilt control layer disposed between the band-pass filter layer and the light absorption layer.

10. The photo detection device of claim 9, wherein an energy bandgap of the reactivity tilt control layer decreases from the band-pass filter layer to the light absorption layer.

11. The photo detection device of claim 10, wherein the energy bandgap of the reactivity tilt control layer is reduced linearly or by steps.

12. The photo detection device of claim 11, wherein:
the reactivity tilt control layer comprises an AlGaN layer; and
an Al content of the reactivity tilt control layer decreases from the band-pass filter layer to the light absorption layer.

13. The photo detection device of claim 1, further comprising a capping layer disposed on a portion of the light absorption layer,
wherein the Schottky layer is disposed on a portion of the capping layer.

14. The photo detection device of claim 13, wherein the capping layer comprises a p-$In_dGa_{1-d}N$ ($0<d<1$) layer.

15. The photo detection device of claim 13, wherein the Schottky layer comprises a material selected from ITO, Pt, W, Ti, Pd, Ru, Cr, and Au.

16. A photo detection device, comprising:
a band-pass filter layer;
a light absorption layer disposed on a first surface of the band-pass filter layer;
a Schottky layer disposed on a first surface of the light absorption layer;
a first electrode layer disposed on a first surface of the Schottky layer; and
a second electrode layer disposed on a portion of a second surface of the band-pass filter layer that opposes the first surface of the band-pass filter layer.

17. The photo detection device of claim 16, further comprising a transparent electrode layer disposed on a second surface of the band-pass filter layer that opposes the first surface of the band-pass filter layer,
wherein the second electrode layer is disposed on a portion of a second surface of the transparent electrode layer that opposes the first surface of the transparent electrode layer.

18. The photo detection device of claim 17, wherein the band-pass filter layer has an etched first surface.

19. The photo detection device of claim 18, wherein the band-pass filter layer is formed on a substrate selected from a sapphire substrate, an SiC substrate, a GaN substrate, an AlN substrate, a Si substrate, and a GaAs substrate, and the first surface of the band-pass filter layer is removed from the substrate, prior to being etched.

20. The photo detection device of claim 18, wherein the band-pass filter layer is etched to a thickness of 0.1 to 1 μm.

21. The photo detection device of claim 16, wherein:
the band-pass filter layer is configured to absorb light of a specific wavelength region; and
the light absorption layer has a smaller energy bandgap than the band-pass filter layer.

22. The photo detection device of claim 21, wherein:
the band-pass filter layer comprises an $Al_xGa_{1-x}N$ ($y<x<1$) layer; and
the light absorption layer comprises an $Al_yGa_{1-y}N$ ($0<y<x$) layer, or an $In_zGa_{1-z}N$ ($0<z<1$) layer.

23. The photo detection device of claim 21, further comprising a reactivity tilt control layer disposed between the band-pass filter layer and the light absorption layer.

24. The photo detection device of claim 23, wherein an energy bandgap of the reactivity tilt control layer decreases from the band-pass filter layer to the light absorption layer.

25. The photo detection device of claim 24, wherein the energy bandgap of the reactivity tilt control layer is reduced linearly or by steps.

26. The photo detection device of claim 25, wherein:
the reactivity tilt control layer comprises an AlGaN layer; and
an Al content of the reactivity tilt control layer decreases from the band-pass filter layer to the light absorption layer.

27. The photo detection device of claim 16, further comprising a capping layer disposed between the light absorption layer and the Schottky layer.

28. The photo detection device of claim 27, wherein the capping layer comprises a p-$In_dGa_{1-d}N$ ($0<d<1$) layer.

29. The photo detection device of claim 27, wherein the Schottky layer comprises a material selected from ITO, Pt, W, Ti, Pd, Ru, Cr, and Au.

* * * * *